(12) United States Patent
Lu et al.

(10) Patent No.: US 11,923,397 B2
(45) Date of Patent: Mar. 5, 2024

(54) MICRO LIGHT EMITTING DIODE DISPLAY SUBSTRATE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Macai Lu, Shenzhen (CN); Yong Fan, Shenzhen (CN); Minggang Liu, Shenzhen (CN); Nian Liu, Shenzhen (CN); Jiangbo Yao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 718 days.

(21) Appl. No.: 17/056,982

(22) PCT Filed: Oct. 20, 2020

(86) PCT No.: PCT/CN2020/122225
§ 371 (c)(1),
(2) Date: Nov. 19, 2020

(87) PCT Pub. No.: WO2022/047907
PCT Pub. Date: Mar. 10, 2022

(65) Prior Publication Data
US 2022/0310693 A1    Sep. 29, 2022

(30) Foreign Application Priority Data
Sep. 1, 2020 (CN) .......................... 202010903445.6

(51) Int. Cl.
*H01L 33/62* (2010.01)
*H01L 27/15* (2006.01)

(52) U.S. Cl.
CPC ............ *H01L 27/156* (2013.01); *H01L 33/62* (2013.01)

(58) Field of Classification Search
CPC ....... H01L 33/62; H01L 21/78; H01L 25/167; H01L 27/1218; H01L 27/1244; G09G 2300/0408
See application file for complete search history.

(56) References Cited

U.S. PATENT DOCUMENTS

2020/0203235 A1    6/2020 Jung et al.
2020/0302841 A1*   9/2020 Jung .................... G09G 3/3275
(Continued)

FOREIGN PATENT DOCUMENTS

CN    110707120 A    1/2020
CN    110910774 A    3/2020
(Continued)

OTHER PUBLICATIONS

International Search Report in International application No. PCT/CN2020/122225, dated Jun. 4, 2021.
(Continued)

*Primary Examiner* — Eric K Ashbahian
(74) *Attorney, Agent, or Firm* — PV IP PC; Wei Te Chung; Zhigang Ma

(57) ABSTRACT

The present invention discloses a micro light emitting diode display substrate and a manufacturing method thereof. The substrate includes an underlay substrate, a thin film transistor and a micro light emitting diode disposed on a top surface of the underlay substrate and connected to each other, a first metal film layer disposed on a bottom surface of the underlay substrate and at least formed with fanout
(Continued)

circuit pattern and a side printed bonding pad. The fanout circuit pattern is connected to the side printed bonding pad, the side printed bonding pad is connected to the thin film transistor through a side wire such that after the display substrate is assembled with a bezel, a top surface display pixel region can maximally approach the bezel, to achieve bezel-less effect.

4 Claims, 12 Drawing Sheets

(56) References Cited

U.S. PATENT DOCUMENTS

| | | | | |
|---|---|---|---|---|
| 2021/0273147 A1* | 9/2021 | Jung | .................... | H01L 33/62 |
| 2021/0318617 A1* | 10/2021 | Huang | .................... | G03F 7/09 |
| 2022/0059517 A1* | 2/2022 | Ikeda | .................... | H01L 25/167 |
| 2022/0246594 A1* | 8/2022 | Shimizu | ................ | H05B 33/22 |
| 2022/0320056 A1* | 10/2022 | Liang | .................... | H01L 33/486 |
| 2022/0384492 A1* | 12/2022 | Lu | .......................... | G09F 9/33 |

FOREIGN PATENT DOCUMENTS

| | | |
|---|---|---|
| CN | 111384067 A | 7/2020 |
| CN | 111584507 A | 8/2020 |
| WO | 2020130493 A1 | 6/2020 |

OTHER PUBLICATIONS

Written Opinion of the International Search Authority in International application No. PCT/CN2020/122225, dated Jun. 4, 2021.
Chinese Office Action issued in corresponding Chinese Patent Application No. 202010903445.6 dated Jun. 3, 2021, pp. 1-8.

* cited by examiner

MICRO LIGHT EMITTING DIODE DISPLAY SUBSTRATE AND MANUFACTURING METHOD THEREOF

RELATED APPLICATIONS

This application is a Notional Phase of PCT Patent Application No. PCT/CN2020/122225 having international filing date of Oct. 20, 2020, which claims the benefit of priority of Chinese Patent Application No. 202010903445.6 filed on Sep. 1, 2020. The contents of the above applications are all incorporated by reference as if fully set forth herein in their entirety.

FIELD OF INVENTION

The present invention relates to a field of display technologies, especially relates to a field of micro light emitting diode display device manufacturing technologies, specifically relates to a micro light emitting diode display substrate and a manufacturing method thereof.

BACKGROUND OF INVENTION

In a field of displays such as liquid crystal display (LCD), organic light emitting diode (OLED), and light emitting diode (LED) displays, the greater a single screen body is, the higher a manufacturing cost (price/area) thereof is. Therefore, a super large display usually is formed by splicing several small displays to lower the cost per area unit. Because a display usually comprises a bezel, a displaying region of the spliced display has several strips of non-display dark regions, which lowers display quality. Reducing a size of splicing gaps of a spliced display has become a popular research object in the industry.

SUMMARY OF INVENTION

Technical Issue

The embodiment of the present invention provides a micro light emitting diode (Micro LED) display substrate and a manufacturing method thereof that can maximally reduce an issue of splicing gaps of high resolution displays and simplify structures of a thin film transistor (TFT) substrate display surface, a bottom surface circuit.

Technical Solution

In a first aspect, the present invention provides a micro light emitting diode display substrate, comprising:
 an underlay substrate comprising a top surface and a bottom surface;
 a thin film transistor formed on the top surface of the underlay substrate;
 a micro light emitting diode disposed on the top surface of the underlay substrate and connected to the thin film transistor;
 a first metal film layer disposed on the bottom surface of the underlay substrate, and at least formed with a fanout circuit pattern, a side printed bonding pad, and a bonding pad; and
 a driver chip disposed on the bottom surface of the underlay substrate and connected to the bonding pad;
 wherein the bonding pad of the first metal film layer is connected to the fanout circuit pattern, the fanout circuit pattern is connected to the side printed bonding pad, and the side printed bonding pad is connected to the thin film transistor through a side wire disposed aside the underlay substrate.

Furthermore, the thin film transistor comprises a second source electrode/pixel electrode, a common cathode, a drain electrode, a second passivation layer covering the drain electrode, and a black matrix layer formed on the second passivation layer; wherein each of the second source electrode/pixel electrode and the common cathode is connected to the micro light emitting diode.

Furthermore, the thin film transistor further comprises: a semiconductor film layer and a light shielding layer; the second source electrode/pixel electrode is connected to the micro light emitting diode, the semiconductor film layer, and the light shielding layer; and the drain electrode is connected to the semiconductor film layer.

Furthermore, wherein the thin film transistor further comprises:
 an insulation layer covering the light shielding layer;
 a second gate electrode insulation layer formed on the semiconductor film layer;
 a second gate electrode metal layer formed on the second gate electrode insulation layer; and
 an interlayer dielectric layer at least covering the insulation layer, the semiconductor film layer, the second gate electrode insulation layer, and the second gate electrode metal layer; wherein:
 the light shielding layer is formed on the top surface of the underlay substrate;
 the semiconductor film layer is formed on the insulation layer;
 a first portion of the second source electrode/pixel electrode is formed on the interlayer dielectric layer and is connected to the micro light emitting diode, a second portion of the second source electrode/pixel electrode extends through the interlayer dielectric layer and the insulation layer and is connected to the light shielding layer, and a third portion of the second source electrode/pixel electrode extends through the interlayer dielectric layer and is connected to the semiconductor film layer;
 a portion of the drain electrode is formed on the interlayer dielectric layer and is covered by the second passivation layer, and another portion of the drain electrode extends through the interlayer dielectric layer and is connected to the semiconductor film layer.

Furthermore, the thin film transistor further comprises a first source electrode, the first source electrode is disposed on an edge of the underlay substrate and is near a side of the side wire, and the first source electrode is connected to the side printed bonding pad through the side wire.

Furthermore, the thin film transistor further comprises a first gate electrode metal layer, the first gate electrode metal layer is disposed on the edge of the underlay substrate and is near the side of the side wire, and the first gate electrode metal layer is connected to the side printed bonding pad through the side wire.

Furthermore, the thin film transistor further comprises a first gate electrode insulation layer, and the first gate electrode metal layer is formed on the first gate electrode insulation layer.

Furthermore, the side wire is formed by a printing process or sequentially by a coating process and a patterning process.

Furthermore, the micro light emitting diode display substrate further comprises a first passivation layer, the first passivation layer is disposed on the bottom surface of the underlay substrate, covers the underlay substrate and the first metal film layer, and exposes the side printed bonding pad and the bonding pad.

Furthermore, the driver chip is disposed on the flexible circuit board by a chip-on-film process, and is connected to the bonding pad through the flexible circuit board.

In a second aspect, the present invention also provides a micro light emitting diode display substrate, comprising:
- an underlay substrate comprising a top surface and a bottom surface;
- a thin film transistor formed on the top surface of the underlay substrate;
- a micro light emitting diode disposed on the top surface of the underlay substrate and connected to the thin film transistor; and
- a first metal film layer disposed on the bottom surface of the underlay substrate, and at least formed with a fanout circuit pattern and a side printed bonding pad;
- wherein the fanout circuit pattern of the first metal film layer is connected to the side printed bonding pad, and the side printed bonding pad is connected to the thin film transistor through a side wire disposed aside the underlay substrate.

Furthermore, the thin film transistor comprises a second source electrode/pixel electrode, a common cathode, a drain electrode, a second passivation layer covering the drain electrode, and a black matrix layer formed on the second passivation layer; wherein each of the second source electrode/pixel electrode and the common cathode is connected to the micro light emitting diode. In some embodiments, the passivation layer and the black matrix layer are self-aligned patterned and formed by a common mask process.

Furthermore, the thin film transistor further comprises: a semiconductor film layer and a light shielding layer; the second source electrode/pixel electrode is connected to the micro light emitting diode, the semiconductor film layer, and the light shielding layer; and the drain electrode is connected to the semiconductor film layer.

Furthermore, the thin film transistor further comprises:
- an insulation layer covering the light shielding layer;
- a second gate electrode insulation layer formed on the semiconductor film layer;
- a second gate electrode metal layer formed on the second gate electrode insulation layer; and
- an interlayer dielectric layer at least covering the insulation layer, the semiconductor film layer, the second gate electrode insulation layer, and the second gate electrode metal layer; wherein:
- the light shielding layer is formed on the top surface of the underlay substrate;
- the semiconductor film layer is formed on the insulation layer;
- a first portion of the second source electrode/pixel electrode is formed on the interlayer dielectric layer and is connected to the micro light emitting diode, a second portion of the second source electrode/pixel electrode extends through the interlayer dielectric layer and the insulation layer and is connected to the light shielding layer, and a third portion of the second source electrode/pixel electrode extends through the interlayer dielectric layer and is connected to the semiconductor film layer; and
- a portion of the drain electrode is formed on the interlayer dielectric layer and is covered by the second passivation layer, and another portion of the drain electrode extends through the interlayer dielectric layer and is connected to the semiconductor film layer.

Furthermore, the thin film transistor further comprises a first source electrode, the first source electrode is located on an edge of the underlay substrate and is formed on the interlayer dielectric layer, and the first source electrode is connected to the side printed bonding pad of the first metal film layer through a side wire disposed aside the underlay substrate.

Furthermore, the thin film transistor further comprises a first gate electrode insulation layer and a first gate electrode metal layer, the first gate electrode insulation layer is located on the edge of the underlay substrate and is formed on the insulation layer and outside the semiconductor film layer, the first gate electrode metal layer is formed on the first gate electrode insulation layer, the first gate electrode metal layer is connected to the side printed bonding pad of the first metal film layer through a side wire disposed aside the underlay substrate.

In a third aspect, the present invention also provides a method for manufacturing the above micro light emitting diode display substrate, comprising steps as follows:
- a step A, manufacturing a first metal film layer on a bottom surface of an underlay substrate, forming at least one fanout circuit pattern and a side printed bonding pad, and connecting the fanout circuit pattern to the side printed bonding pad;
- a step B, manufacturing a thin film transistor on a top surface of the underlay substrate;
- a step C, connecting a micro light emitting diode disposed on the top surface of the underlay substrate to the thin film transistor; and
- a step D, connecting the thin film transistor through a side wire disposed aside the underlay substrate to the side printed bonding pad of the first metal film layer.

Furthermore, the step B comprises:
- a step b6, forming a metal film layer, and patterning the metal film layer to at least form a drain electrode, a second source electrode/pixel electrode and a common cathode; and
- a step b7, self-aligned patterning and forming a second passivation layer and a black matrix layer on the drain electrode by a common mask process such that the second passivation layer covers the drain electrode and The black matrix layer covers a surface of the second passivation layer;
- wherein the step C comprises bonding the micro light emitting diode on the second source electrode/pixel electrode and the common cathode.

Furthermore, the step B further comprises:
- a step b1, forming a light shielding layer on the top surface of the underlay substrate;
- a step b2, forming an insulation layer on the light shielding layer and the top surface of the underlay substrate;
- a step b3, forming a semiconductor film layer on the insulation layer;
- a step b4, forming a second gate electrode insulation layer on the semiconductor film layer and forming a second gate electrode metal layer on the second gate electrode insulation layer; and
- a step b5, forming an interlayer dielectric layer such that the interlayer dielectric layer at least covers the insulation layer, the semiconductor film layer, the second gate electrode insulation layer, and the second gate electrode metal layer;
- wherein in the step b6, the drain electrode is formed on the interlayer dielectric layer; a first portion of the second source electrode/pixel electrode is located above the interlayer dielectric layer and is connected to the micro light emitting diode, a second portion of the second source electrode/pixel electrode extends through the interlayer dielectric layer and the insulation layer and is connected to the light shielding layer, a third portion of the second source electrode/pixel electrode extends through the interlayer dielectric layer and is connected to the semiconductor film layer; a portion of the drain electrode is formed on the interlayer dielectric layer, and another portion extends through the interlayer dielectric layer and is connected to the semiconductor film layer.

Furthermore, in the step b6, the patterning also forms a first source electrode, the first source electrode is formed on the interlayer dielectric layer and is located on an edge of the underlay substrate. The step D connects the first source electrode to the side printed bonding pad of the first metal film layer through the side wire disposed aside the underlay substrate.

Furthermore, the step b4 further comprises forming a first gate electrode insulation layer above the insulation layer, outside the semiconductor film layer, and on the edge of the underlay substrate, and forming a first gate electrode metal layer on the first gate electrode insulation layer. In the step b5, the interlayer dielectric layer further covers a portion of the first gate electrode insulation layer and a portion of the first gate electrode metal layer such that at least one portion of a surface of the first gate electrode metal layer is exposed and configured to connect with the side wire. The step D comprises connecting the first gate electrode metal layer to the side printed bonding pad of the first metal film layer through the side wire disposed aside the underlay substrate.

Advantages

Compared to the prior art, the present invention manufactures a fanout circuit on the bottom surface of the underlay substrate, the fanout circuit can connect with a driver chip (IC) through bonding pads, and the bottom surface can further connect with an electro static protection circuit or the like. The TFT and Micro LED are manufactured on the top surface of the underlay substrate for display, the fanout circuit of the underlay substrate bottom surface and the display pixel (i.e., the TFT and the Micro LED) of the top surface of the underlay substrate are connected to the side printed bonding pad (side wiring pad) through the side wire aside the underlay substrate such that a display pixel region located on the top surface of the underlay substrate, after the micro light emitting diode display substrate is assembled with a bezel, can maximally approach the bezel to make a width of a splicing gap between the display pixel region and the bezel reach a size of one pixel unit and no obvious splicing mark at the macro level, which achieves a bezel-less effect. Therefore, using such technology on a spliced display has no obvious splicing non-displaying region among spliced displays, which improves the quality of the spliced display.

Furthermore, the present invention solution directly bonds the micro LED on the source and drain metal electrode layer of the TFT (i.e., the second source electrode/pixel electrode and the common cathode) without an independent process for forming holes in the passivation layer and an individual process for manufacturing the ITO pixel electrode layer. Only a common mask process is required for self-aligned patterning the passivation layer and the black matrix layer, which skips the additional processes for forming holes in the passivation layer and manufacturing the ITO pixel electrode layer. Therefore, the top surface of the display substrate only requires seven processes for completing manufacture of the TFT, which simplifies the structure and manufacture of the TFT surface of the display substrate and advantages improvement of the production rate and reduction of the manufacturing cost.

DETAILED DESCRIPTION OF PREFERRED EMBODIMENTS

Figure 1:
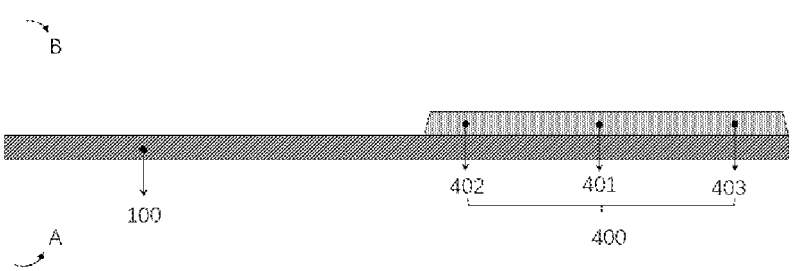
FIGS. 1 to 15 are schematic views of a manufacturing process of an embodiment of a micro light emitting diode display substrate of the present invention.

With reference to FIGS. 1 to 24, FIGS. 1 to 15 are schematic views of a manufacturing process of an embodiment of a micro light emitting diode display substrate of the present invention; FIGS. 16 to 24 are schematic views of a manufacturing process of another embodiment of the micro light emitting diode display substrate of the present invention. FIG. 15 is also a schematic structural view of the micro light emitting diode display substrate of an embodiment of the present invention. FIG. 24 is also a schematic structural view of the micro light emitting diode display substrate of another embodiment of the present invention. In the figures, A refers to a top surface of the underlay substrate 100, B refers to a bottom surface of the underlay substrate 100.

With reference to FIGS. 15 and 24, the embodiment of the present invention provides a micro light emitting diode display substrate, comprises an underlay substrate 100, a thin film transistor 200, a micro light emitting diode 300, a first metal film layer 400, and a side wire 500.

The underlay substrate 100 comprises a top surface, a bottom surface, and a sidewall connecting the top surface to the bottom surface. The underlay substrate 100 can be a glass substrate.

The thin film transistor 200 is formed on the top surface (i.e., the A surface) of the underlay substrate 100.

The micro light emitting diode 300 disposed on the top surface of the underlay substrate 100 and is connected to the thin film transistor 200.

The side wire 500 is disposed aside the underlay substrate 100. Specifically, with reference to FIGS. 15 and 24, the side wire 500 is formed on a sidewall surface of the underlay substrate 100. Two ends of the side wire 500, through an edge (a side near the side wire 500) extending to the top surface of the underlay substrate 100 and an edge (a side near the side wire 500) extending to the bottom surface of the underlay substrate 100, are connected to the thin film transistor 200 and the side printed bonding pad 403 respectively to further achieve connection of the thin film transistor 200 located on the top surface of the underlay substrate 100 with a circuit (for example, fanout circuit pattern 401) located on the bottom surface of the underlay substrate 100 through the side wire 500.

The side wire 500 can be formed by a printing process or sequentially by a coating process and a patterning process. The side wire can use metal of a low melting point, for example, In, Ag, Ga, Sn, or an alloy thereof.

The first metal film layer 400 is disposed on the bottom surface (i.e., the B surface) of the underlay substrate 100. The first metal film layer 400 is at least formed with a fanout circuit pattern 401 and a side printed bonding pad 403. In the first metal film layer 400, the fanout circuit pattern 401 is electrically connected to the side printed bonding pad 403. The side printed bonding pad 403 is connected to the thin film transistor 200 through the side wire 500.

The thin film transistor 200 of present embodiment formed on the A surface is connected to the micro light emitting diode 300 and configured to a control brightness variation of the light emitting diode 300. The A surface serves as a display surface of the display substrate. The thin film transistor 200 formed on the A surface is electrically connected to the fanout circuit pattern 401 of the B surface through the side wire 500 disposed aside the underlay substrate 100 and the side printed bonding pad 403, and such structure makes the fanout circuit originally on the top surface of the underlay substrate 100 be able to move to the bottom surface of the underlay substrate 100. Therefore, the display pixel region located on the top surface of the underlay substrate 100, after the display substrate of micro light emitting diode 300 is assembled with a bezel, can maximally approach the bezel to make a width of a splicing gap between the display pixel region and the bezel reach a size of one pixel unit and no obvious splicing mark at the macro level, which achieves a bezel-less effect. Therefore, using such technology on a spliced display has no obvious splicing non-displaying region among spliced displays, which improves the quality of the spliced display.

In some embodiments, the B surface can further form other circuit, for example, a bonding pad, an electro static protection circuit or the like. For example, as shown in FIGS. 15 and 24, the first metal film layer 400 is further formed with a bonding pad 402, and the bonding pad 402 is electrically connected to the fanout circuit pattern 401.

A first passivation layer 600 is further disposed on the bottom surface of the underlay substrate 100. The first passivation layer 600 is disposed on the bottom surface of the underlay substrate 100, covers the underlay substrate 100 and the first metal film layer 400 and exposes the side printed bonding pad 403 and the bonding pad 402.

The micro light emitting diode display substrate further comprises: a driver chip 800. The driver chip 800 is connected to the bonding pad 402. For example, the driver chip 800 can be disposed on the flexible circuit board 700 through a method of chip-on-film (COF), and is connected to the bonding pad 402 through the flexible circuit board 700. The flexible circuit board 700 can be further connected to the bonding pad 402 through a conductive glue 1400.

With reference to FIGS. 15 and 24, in some embodiments, the thin film transistor 200 comprises a second source electrode/pixel electrode 211, a common cathode 212, a drain electrode 210, a second passivation layer 213 covering the drain electrode 210, and a black matrix layer 214 formed on the second passivation layer 213. The second source electrode/pixel electrode 211 and the common cathode 212 are electrically connected to the micro light emitting diode 300. The passivation layer 213 and the black matrix layer 214 can be self-aligned patterned and formed by a common mask process. The passivation layer 213 and the black matrix layer 214 commonly serve as a light shielding layer and a water oxygen protection layer on a top of the thin film transistor 200.

With reference to FIGS. 15 and 24, in some embodiments, the thin film transistor 200 further comprises: a semiconductor film layer 203 and a light shielding layer 201. The second source electrode/pixel electrode 211 is connected to the micro light emitting diode 300, the semiconductor film layer 203, and the light shielding layer 201. The drain electrode 210 is connected to the semiconductor film layer 203.

With reference to FIGS. 15 and 24, in some embodiments, the thin film transistor 200 further comprises:
an insulation layer 202 covering the light shielding layer 201;
an second gate electrode insulation layer 206 formed on the semiconductor film layer 203;
a second gate electrode metal layer 207 formed on the second gate electrode insulation layer 206; and
an interlayer dielectric layer 208 at least covering the insulation layer 202, the semiconductor film layer 203, second gate electrode insulation layer 206, and the second gate electrode metal layer 207; wherein:
the light shielding layer 201 is formed on the top surface of the underlay substrate 100;
the semiconductor film layer 203 is formed on the insulation layer 20;
a first portion of the second source electrode/pixel electrode 211 is formed on the interlayer dielectric layer 208 and is connected to the micro light emitting diode 300, a second portion of the second source electrode/ pixel electrode 211 extends through the interlayer dielectric layer 208 and is connected to the insulation layer 202 and the light shielding layer 201, and a third portion of the second source electrode/pixel electrode 211 extends through the interlayer dielectric layer 208 and is connected to the semiconductor film layer 203;
a portion of the drain electrode 210 is formed on the interlayer dielectric layer 208 and is covered by the second passivation layer 213, and another portion of the drain electrode 210 extends through the interlayer dielectric layer 208 and is connected to the semiconductor film layer 203.

In the present embodiment, a method for connecting the second source electrode/pixel electrode 211 to the light shielding layer 201, connecting the second source electrode/pixel electrode 211 to the semiconductor film layer 203, and connecting the drain electrode 210 to the semiconductor film layer 203. For example, a first via hole 2081 is defined in the insulation layer 202 and the interlayer dielectric layer 208 such that first via hole 2081 extends through the insulation layer 202 and the interlayer dielectric layer 208 and extends in the light shielding layer 201. a second via hole 2082 and a third via hole 2083 are defined in the interlayer dielectric layer 208, extend through the interlayer dielectric layer 208 and extend in the semiconductor film layer 203. the second portion of the second source electrode/pixel electrode 211 is connected to The light shielding layer 201 through the first via hole, the third portion of the second source electrode/ pixel electrode 211 is connected to the semiconductor film layer 203 through the second via hole 2082. The drain electrode 210 is connected to the semiconductor film layer 203 through the third via hole 2083.

With reference to FIG. 15, in some embodiments, the thin film transistor 200 further comprises a first source electrode 209. The first source electrode 209 is located on an edge of the underlay substrate 100 (the side near the side wire 500), and is formed on the interlayer dielectric layer 208. The first source electrode 209 is connected to a side printed bonding pad 403 of the first metal film layer 400 through the side wire 500 disposed aside the underlay substrate 100. At least one portion of a surface of the first source electrode 209 is exposed and configured to connect with the side wire 500.

Alternatively, with reference to FIG. 24, in some other embodiments, the thin film transistor 200 further comprises a first gate electrode insulation layer 204 and a first gate electrode metal layer 205. The first gate electrode insulation layer 204 is located on the edge of the underlay substrate 100 (the side near the side wire 500), and is formed on the insulation layer 202 and out of the semiconductor film layer 203. The first gate electrode metal layer 205 is formed on the first gate electrode insulation layer 204. the first gate electrode metal layer 205 is connected to the side printed bonding pad 403 of the first metal film layer 400 through the side wire 500. In the present embodiment, the first gate electrode insulation layer 204 and the second gate electrode insulation layer 206 can be manufactured and formed simultaneously, and the first gate electrode metal layer 205 and the second gate electrode metal layer 207 can be manufactured and formed simultaneously. Furthermore, the interlayer dielectric layer 208 can cover a portion of the first gate electrode insulation layer 204 and a portion of the first gate electrode metal layer 205. For example, with reference to FIG. 24, the side surface of the first gate electrode insulation layer 204 and the side surface and a portion of the top surface of the first gate electrode metal layer 205 are covered, and simultaneously at least one portion of a surface of the first gate electrode metal layer 205 is required to be exposed and be configured to connect with the side wire 500.

With reference to FIGS. 1 to 24, the present embodiment also provides a method for manufacturing the micro light emitting diode display substrate, comprises steps as follows:
  a step A, manufacturing a first metal film layer on a bottom surface of an underlay substrate, forming at least one fanout circuit pattern 401 and a side printed bonding pad 403, and connecting the fanout circuit pattern 401 to the side printed bonding pad 403;
  a step B, manufacturing a thin film transistor 200 on a top surface of the underlay substrate 100;
  a step C, connecting a micro light emitting diode 300 disposed on the top surface of the underlay substrate 100 to the thin film transistor 200; and
  a step D, connecting the thin film transistor 200 through a side wire 500 disposed aside the underlay substrate 100 to the side printed bonding pad 403 of the first metal film layer 400.

Figure 13:
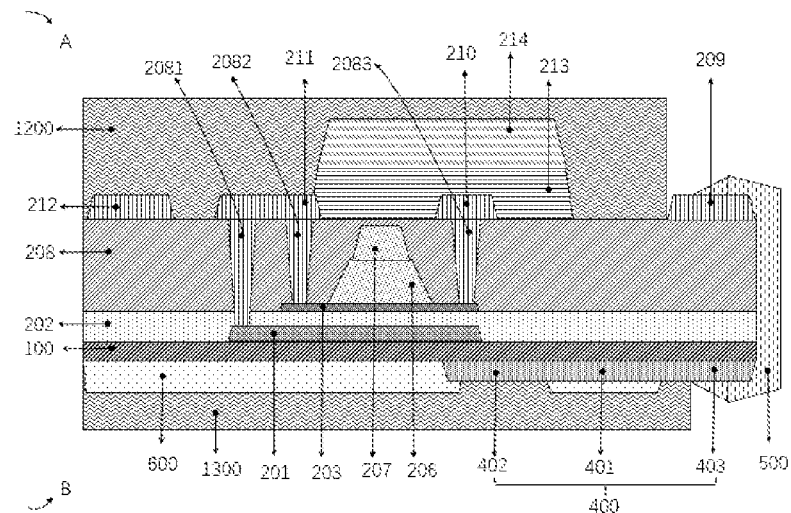
Figure 22:
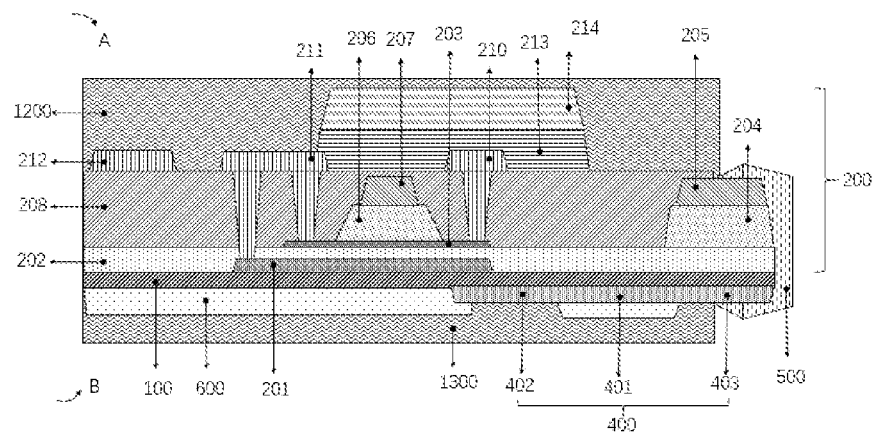

With reference to FIGS. 13 and 22, the side wire 500 is formed on a surface of a sidewall of the underlay substrate 100. Two ends of the side wire 500, through an edge (a side near the side wire 500) extending to the top surface of the underlay substrate 100 and an edge (a side near the side wire 500) extending to the bottom surface of the underlay substrate 100, are connected to the thin film transistor 200 and the side printed bonding pad 403 respectively to further achieve connection of the thin film transistor 200 located on the top surface of the underlay substrate 100 with a circuit (for example, fanout circuit pattern 401) located on the bottom surface of the underlay substrate 100 through the side wire 500.

The side wire 500 can be formed by a printing process or sequentially by a coating process and a patterning process. The side wire can use metal of a low melting point, for example, In, Ag, Ga, Sn, or an alloy thereof.

The thin film transistor 200 of the method of the present embodiment formed on the A surface is connected to the micro light emitting diode 300 and is configured to control a brightness variation of the light emitting diode 300. The A surface serves as a display surface of the display substrate. The thin film transistor 200 formed on the A surface is electrically connected to the side printed bonding pad 403 of the B surface through the side wire 500 disposed aside the underlay substrate 100 to further achieve electrical connection of the thin film transistor 200 on the A surface with The fanout circuit pattern 401 on the B surface. Such structure makes the circuit originally on the top surface of the underlay substrate 100 be able to move to the bottom surface of the underlay substrate 100 such that the display pixel region on the top surface of the underlay substrate 100 can maximally approach the display bezel to make a width of a splicing gap between the display pixel region and the bezel reach a size of one pixel unit and no obvious splicing mark at the macro level, which achieves a bezel-less effect. Therefore, using such technology on a spliced display has no obvious splicing non-displaying region among spliced displays, which improves the quality of the spliced display.

In an embodiment, With reference to FIGS. 15 and 24, the B surface can further formed with other circuit, for example, aa bonding pad 402, an electro static protection circuit or the like. For example, in the step A, a bonding pad 402 is further formed on the first metal film layer 400, and the bonding pad 402 is connected to the fanout circuit pattern 401.

The bonding pad 402 can be further connected to the driver chip 800. For example, the method for manufacturing the micro light emitting diode display substrate further comprises: disposing a driver chip 800 on the bottom surface of the underlay substrate 100 and connecting the driver chip 800 to the bonding pad 402. The driver chip 800 can be disposed on the flexible circuit board 700 through a chip-on-film (COF) process and is connected to the bonding pad 402 through the flexible circuit board 700. The flexible circuit board 700 can be connected to the bonding pad 402 through a conductive glue 1400.

With reference to FIGS. 1 to 15 and FIGS. 16 to 24, in some embodiments, the step B comprises:
  a step b6, forming a metal film layer, and patterning the metal film layer to at least form a drain electrode 210, a second source electrode/pixel electrode 211 and a common cathode 212; and
  a step b7, self-aligned patterning and forming a second passivation layer 213 and a black matrix layer 214 on the drain electrode 210 by a common mask process such that the second passivation layer 213 covers the drain electrode 210 and The black matrix layer 214 covers a surface of the second passivation layer 213; wherein the passivation layer 213 and the black matrix layer 214 commonly serve as a light shielding layer 201 and a water oxygen protection layer for a top of the thin film transistor 200;

The step C comprises bonding the micro light emitting diode 300 on the second source electrode/pixel electrode 211 and the common cathode 212.

A structure of a conventional thin film transistor usually comprises a semiconductor layer, a gate electrode insulation layer, a gate electrode, interlayer dielectric layer, a source and drain metal electrode layer, a passivation layer, and a indium tin oxide (ITO) pixel electrode layer. generally, the micro light emitting diode is bonded on the ITO pixel electrode layer of the thin film transistor, and hole formation in the passivation layer usually requires an independent process. Also, manufacturing the ITO pixel electrode layer needs an individual process. However, the present invention solution bonds the micro light emitting diode 300 on the source and drain metal electrode layer of the thin film transistor (i.e., the second source electrode/pixel electrode 211 and the common cathode 212), which skips the additional processes for forming holes in the passivation layer and manufacturing the ITO pixel electrode layer. Namely, the present invention requires neither an independent process for hole formation in the passivation layer nor an individual process for manufacturing the ITO pixel electrode layer, but only requires to employ a common mask process to self-aligned pattern the passivation layer and the black matrix layer 214. Therefore, the top surface of the display substrate only requires seven processes to complete manufacture of the thin film transistor 200, which simplifies structure and production processes of the display substrate thin film transistor and facilitates improvement of a production rate and reduction of a manufacturing cost.

With reference to FIGS. 1 to 15 and FIGS. 16 to 24, in some embodiments, the step B further comprises:
- a step b1, forming a light shielding layer 201 on a top surface of the underlay substrate 100;
- a step b2, forming an insulation layer 202 on the light shielding layer 201 and the top surface of the underlay substrate 100;
- a step b3, forming a semiconductor film layer 203 on the insulation layer 202;
- a step b4, forming a second gate electrode insulation layer 206 on the semiconductor film layer 203 and forming a second gate electrode metal layer 206 on the second gate electrode insulation layer 206; and
- a step b5, forming an interlayer dielectric layer 208 such that the interlayer dielectric layer at least covers the insulation layer 202, the semiconductor film layer 203, the second gate electrode insulation layer 206, and the second gate electrode metal layer 207;
- wherein in the step b6, the drain electrode 210 is formed on the interlayer dielectric layer 208; a first portion of the second source electrode/pixel electrode 211 is located above the interlayer dielectric layer 208 and is connected to the micro light emitting diode 300, a second portion of the second source electrode/pixel electrode 211 extends through the interlayer dielectric layer 208 and the insulation layer 202 and is connected to the light shielding layer, a third portion of the second source electrode/pixel electrode 211 extends through the interlayer dielectric layer 208 and is connected to the semiconductor film layer 203; a portion of the drain electrode 210 is formed on the interlayer dielectric layer 208, and another portion extends through the interlayer dielectric layer 208 and is connected to the semiconductor film layer 203.

In the present embodiment, a method of connecting the second source electrode/pixel electrode 211 to the light shielding layer 201, connecting the second source electrode/pixel electrode 211 to the semiconductor film layer 203, and connecting the drain electrode 210 to the semiconductor film layer 203 is achieved. For example: a first via hole 2081 is defined in the insulation layer 202 and the interlayer dielectric layer 208 such that the first via hole 2081 extends through the insulation layer 202 and the interlayer dielectric layer 208 and in the light shielding layer 201. A second via hole 2082 and a third via hole 2083 are defined through the interlayer dielectric layer 208 and extend in the semiconductor film layer 203. The second portion of the second source electrode/pixel electrode 211 is connected to the light shielding layer 201 through the first via hole 2081, the third portion of the second source electrode/pixel electrode 211 is connected to the semiconductor film layer 203 through the second via hole 2082. The drain electrode 210 is connected to the semiconductor film layer 203 the through the third via hole 2083.

With reference to FIGS. 1 to 15, in some embodiments, in the step b6, the step of patterning further forms a first source electrode 209, the first source electrode 209 is formed on the interlayer dielectric layer 208 and is located on an edge of the underlay substrate 100 (the side near the side wire 500). The step D connects the first source electrode 209 to a side printed bonding pad 403 of the first metal film layer 400 through a side wire 500 disposed aside the underlay substrate 100. At least one portion of a surface of the first source electrode 209 is exposed and configured to connect with the side wire 500.

With reference to FIGS. 16 to 24, in some embodiments, the step b4 further comprises forming a first gate electrode insulation layer 204 above the insulation layer 202, outside the semiconductor film layer 203, and on the edge of the underlay substrate 100 (the side near the side wire 500), and forming a first gate electrode metal layer 205 above the first gate electrode insulation layer 204. In the step b5, the interlayer dielectric layer 208 further covers a portion of the first gate electrode insulation layer 204 and a portion of the first gate electrode metal layer 205 such that at least one portion of a surface of the first gate electrode metal layer 205 is exposed and configured to connect with the side wire 500. The step D connects the first gate electrode metal layer 205 to the side printed bonding pad 403 of the first metal film layer 400 through a side wire 500 disposed aside the underlay substrate 100.

In the present embodiment, the first gate electrode insulation layer 204 and the second gate electrode insulation layer 206 can be manufactured and formed simultaneously, and the first gate electrode metal layer 205 and the second gate electrode metal layer 207 can be manufactured and formed simultaneously. Furthermore, the interlayer dielectric layer 208 can cover a portion of the first gate electrode insulation layer 204 and a portion of the first gate electrode metal layer 205. For example, with reference to FIG. 24, covering the side surface of the first gate electrode insulation layer 204 and the side surface and a portion of the top surface of the first gate electrode metal layer 205 requires at least one portion of the surface of the first gate electrode metal layer 205 to be exposed and configured to connect with the side wire 500.

Two of specific manufacturing methods for the micro light emitting diode 300 display substrate of the present invention are described as follows. FIGS. 1 to 15 are schematic views of a manufacturing process of an embodiment of a micro light emitting diode display substrate of the present invention, and FIGS. 16 to 24 are schematic views of a manufacturing process of another embodiment of the micro light emitting diode display substrate of the present invention. In the figures, A refers to a top surface of the underlay substrate 100, B refers to a bottom surface of the underlay substrate 100.

With reference to FIGS. 1 to 15, a micro light emitting diode display substrate manufacturing method, comprises steps as follows:

A step (1), with reference to FIG. 1, comprises coating a metal film on the bottom surface (B surface in the figures) of the underlay substrate 100 to form a first metal film layer 400, and patterning the first metal film layer 400 to form at least one fanout circuit pattern 401, a bonding pad 402, and a side printed bonding pad 403. wherein: and a side printed bonding pad 403 is on an edge of the underlay substrate 100 and near an end of the side wire 500 and is configured to connect with the side wire 500; a bonding pad 402 is on another end of the first metal film layer 400 and is configured to connect with the driver chip 800; a fanout circuit pattern 401 is located the side printed bonding pad 403 and the bonding pad 402 between on the first metal film layer 400. The side printed bonding pad 403 is connected to the fanout circuit pattern 401, and the fanout circuit pattern 401 is connected to the bonding pad 402. For advantage of the connection of first metal film layer 400 with the side wire 500, the first metal film layer 400 can be disposed on a side near the side wire 500; the underlay substrate 100 can use a glass substrate. A film layer material can use a Mo, Mo/Al/Mo lamination layer, a Mo/Cu lamination layer, a Mo/Cu/IZO lamination layer, a IZO/Cu/IZO lamination layer, a Mo/Cu/ITO lamination layer, a Ni/Cu/Ni lamination layer, a MoTiNi/Cu/MoTiNi lamination layer, a NiCr/Cu/NiCr lamination layer, or a CuNb.

Figure 2:
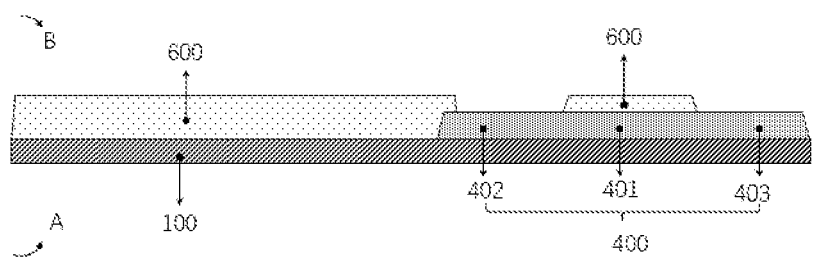

A step (2), with reference to FIG. 2, comprises coating a coating on the underlay substrate 100 and the first metal film layer 400 such that the coating covers the underlay substrate 100 and the first metal film layer 400, and patterning and fully or partially exposing the side printed bonding pad 403 and the bonding pad 402 on two ends of the first metal film layer 400 exposed to form a first passivation layer 600. Fully or partially exposing the side printed bonding pad 403 facilitates connection with the side wire 500. Fully or partially exposing the bonding pad 402 facilitates connection with the driver chip 800. A film layer material of the first passivation layer 600 can use SiNx or SiOx.

Figure 3:
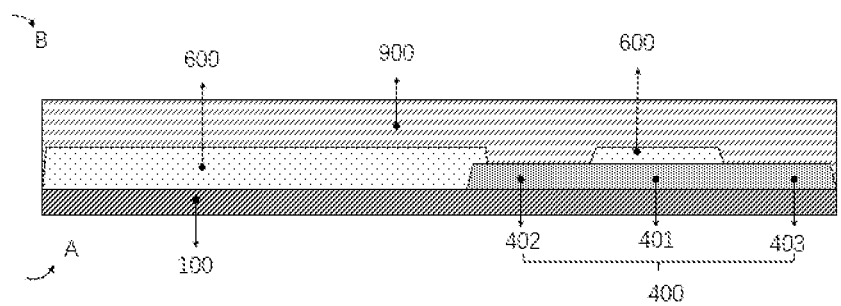

A step (3), with reference to FIG. 3, comprises forming a first bottom surface protective film layer 900 on the first passivation layer 600 and the first metal film layer 400 for preventing damages to the bottom surface of the underlay substrate 100 during manufacturing and for protecting the structure of the underlay substrate 100 bottom surface. A material of the first bottom surface protective film layer 900 can use SiNx or SiOx.

Figure 4:
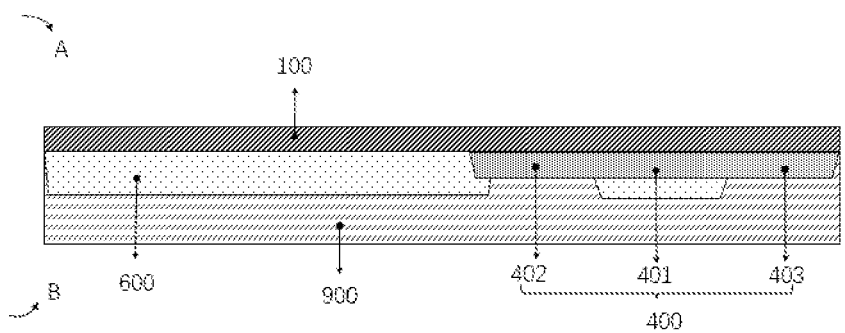

A step (4), with reference to FIG. 4, comprises rotating the underlay substrate 100 such that the bottom surface of the underlay substrate 100 faces upward.

Figure 5:
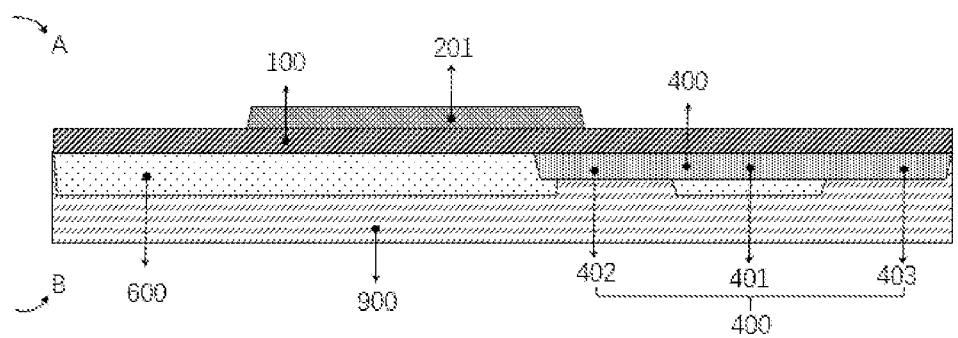

A step (5), with reference to FIG. 5, comprises coating a coating on the top surface of the underlay substrate 100, and patterning the coating to form a light shielding layer 201. wherein: light shielding layer 201 material can use Mo, a Mo/Al/Mo lamination layer, a Mo/Cu lamination layer, a Mo/Cu/IZO lamination layer, a IZO/Cu/IZO lamination layer, a Mo/Cu/ITO lamination layer, a Ni/Cu/Ni lamination layer, a MoTiNi/Cu/MoTiNi lamination layer, a NiCr/Cu/NiCr lamination layer, or CuNb.

Figure 6:
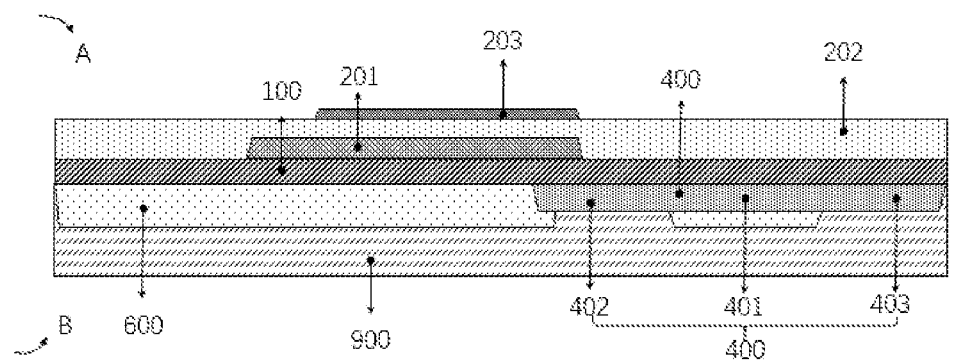

A step (6), with reference to FIG. 6, comprises coating a coating on the underlay substrate 100 and the light shielding layer 201 such that the coating covers the underlay substrate 100 and the light shielding layer 201 to form an insulation layer 202 (i.e., a buffer insulation layer); coating a coating on the insulation layer 202, and patterning the coating to obtain a semiconductor film layer 203. A film layer material of the insulation layer 202 can use SiOx, SiNx, SiNx/SiOx lamination layer or SiNOx. A material of the semiconductor film layer 203 is IGZO, IGTO, IGZO, IGO, IZO, or AIZO.

Figure 7:
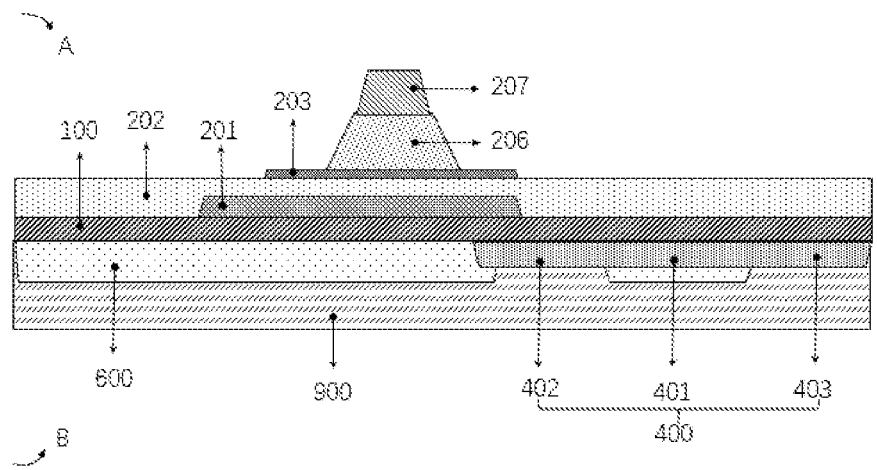

A step (7), with reference to FIG. 7, comprises coating a coating on the semiconductor film layer 203, and manufacturing a second gate electrode insulation layer 206 and a second gate electrode metal layer 207. For example, a coating is coated on the semiconductor film layer 203 to form a gate electrode insulation film layer, and a gate electrode metal film layer is coated on the gate electrode insulation film layer, then the gate electrode metal film layer is patterned to obtain a second gate electrode metal layer 207, then the gate electrode metal film layer is self-aligned patterned by the second gate electrode metal layer 207 to obtain a second gate electrode insulation layer 206. The gate electrode insulation film layer material can use SiOx, SiNx, a Al$_2$O$_3$/SiNx/SiOx lamination layer, or a SiOx/SiNx/SiOx lamination layer. The gate electrode metal film layer material can use a Mo, Mo/Al lamination layer, a Mo/Cu lamination layer, a Mo/Cu/IZO lamination layer, IZO/Cu/IZO lamination layer, Mo/Cu/ITO lamination layer, Ni/Cu/Ni lamination layer, a MoTiNi/Cu/MoTiNi lamination layer, a NiCr/Cu/NiCr lamination layer, or CuNb.

Figure 8:
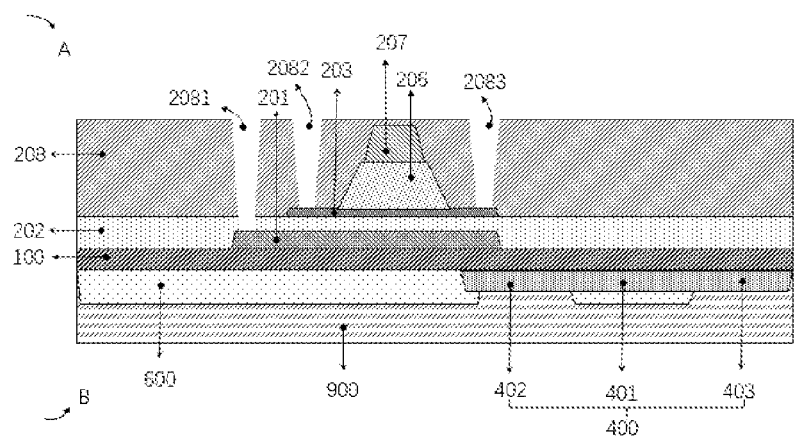

A step (8), with reference to FIG. 8, comprises coating a coating on the insulation layer 202, the semiconductor film layer 203, the second gate electrode insulation layer 206, and the second gate electrode metal layer 207 such that the coating covers the insulation layer 202, the semiconductor film layer 203, the second gate electrode insulation layer 206, and the second gate electrode metal layer 207, patterning the coating, forming an interlayer dielectric layer 208, and defining three via holes through the interlayer dielectric layer 208 which are a first via hole 2081, a second via hole 2082 and a third via hole 2083; wherein first via hole 2081 extends through interlayer dielectric layer 208 and the insulation layer 202 and extends in the light shielding layer 201, both the second via hole 2082 and the third via hole 2083 extend through interlayer dielectric layer 208 and extend in the semiconductor film layer 203. The three via holes can be formed by an etching process. A film layer material of the interlayer dielectric layer 208 can use SiOx, SiNx, or SiNOx.

Figure 9:
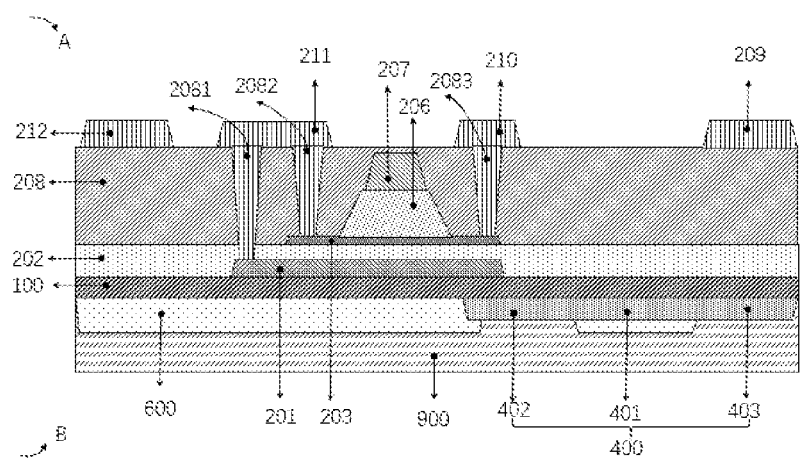

A step (9) With reference to FIG. 9, comprising coating and forming a metal film layer on the interlayer dielectric layer 208, and patterning the metal film layer to form a first source electrode 209, a drain electrode 210, a second source electrode/pixel electrode 211, and a common cathode 212. The first source electrode 209 is located on the interlayer dielectric layer 208, a surface thereof is exposed and configured to connect with the side wire 500. The drain electrode 210 is connected to the semiconductor film layer 203 through the third via hole 2083. A portion of the second source electrode/pixel electrode 211 located on the interlayer dielectric layer 208 so called first portion and is configured to connect with the micro light emitting diode 300. A second portion of the second source electrode/pixel electrode 211 is connected to the light shielding layer 201 through the first via hole 2081. A third portion of the second source electrode/pixel electrode 211 is connected to the semiconductor film layer 203 through the second via hole 2082. The common cathode 212 is located on the interlayer dielectric layer 208 and is configured to connect with the micro light emitting diode 300. The drain electrode 210 is connected to the semiconductor film layer 203 through the third via hole 2083. A material of the metal film layer can use a Mo, Mo/Al lamination layer, a Mo/Cu lamination layer, a Mo/Cu/IZO lamination layer, IZO/Cu/IZO lamination layer, Mo/Cu/ITO lamination layer, Ni/Cu/Ni lamination layer, a MoTiNi/Cu/MoTiNi lamination layer, a NiCr/Cu/NiCr lamination layer, or CuNb.

Figure 10:
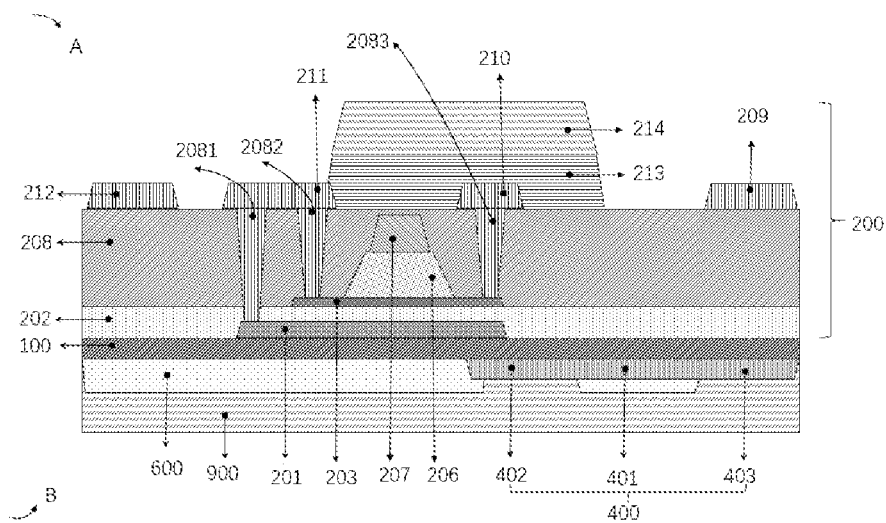

A step (10), with reference to FIG. 10, comprises self-aligned patterning and forming a second passivation layer 213 and a black matrix 214 on the drain electrode 210 by a common mask process such that the second passivation layer 213 covers the drain electrode 210 and the black matrix layer 214 covers the second passivation layer 213 to complete manufacturing the thin film transistor 200. For example, the drain electrode 210 is coated to form a film layer of a second passivation layer 213, then the film layer of the second passivation layer 213 is coated to form a film layer of a black matrix layer 214, the film layer of the black matrix layer 214 is patterned to obtain a black matrix layer 214. The film layer of the second passivation layer 213 is etched by a self-aligned process through a hard mask using the black matrix layer 214, to obtain a second passivation layer 213. The etching process can be a dry etching process. A film layer material of the second passivation layer 213 can use SiOx, SiNx, or SiNOx.

Figure 11:
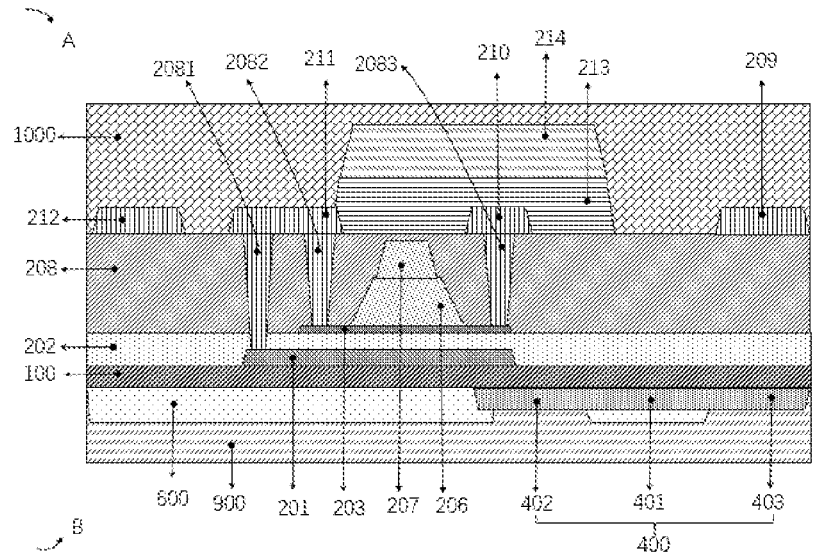

A step (11), with reference to FIG. 11, comprises coating a second top surface protective film layer 1000 on the underlay substrate 100 top surface (A surface) such that the second top surface protective film layer 1000 covers the interlayer dielectric layer 208, the first source electrode 209, the second source electrode/pixel electrode 211, the common cathode 212, the second passivation layer 213, and the black matrix 214 to protect the top surface of the underlay substrate 100.

Figure 12:
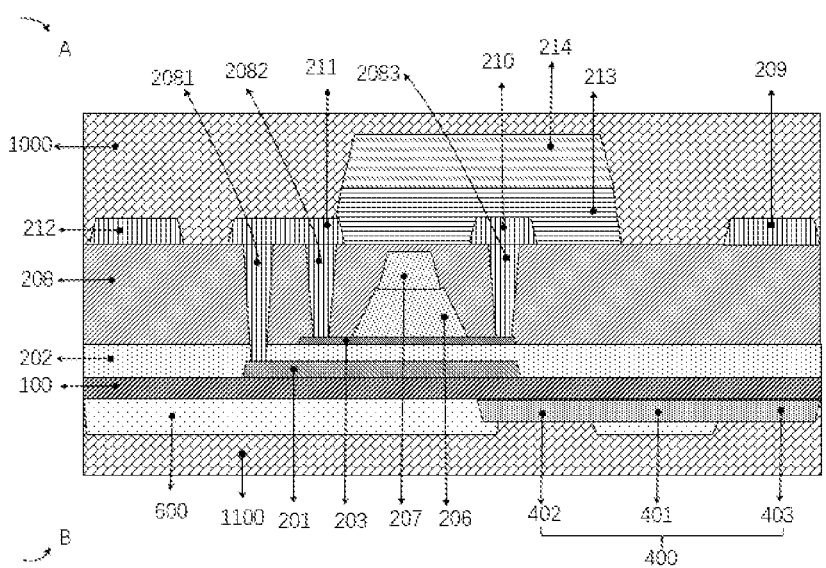

A step (12), with reference to FIGS. 12 and 13, comprises removing the first bottom surface protective film layer 900, and coating a second bottom surface protective film layer 1100 on the bottom surface of the underlay substrate 100 for protecting the circuit of the bottom surface of the underlay substrate 100 from damages during the process, and then removing the second bottom surface protective film layer 1100 and the second top surface protective film layer 1000 after a cutting process, coating a third top surface protective film layer 1200 and a third bottom surface protective film layer 1300 on two sides of the underlay substrate 100 (the A surface and the B surface), and exposing a connection portion between the first source electrode 209 and the side wire 500, and a connection portion between the first metal film layer 400 and the side wire 500 for connection with the side wire 500. A material of each of the second top surface protective film layer 1000, the second bottom surface protective film layer 1100, the third top surface protective film layer 1200, and the third bottom surface protective film layer 1300 can use organic glue.

A step (13) With reference to FIG. 13, comprises connecting the side printed bonding pad 403 of the first metal film layer 400 to the first source electrode 209 through the side wire 500. The side wire 500 can be formed on a surface of a sidewall of the underlay substrate 100 by a printing process or sequentially by a coating process and a patterning process. Two ends of the side wire 500, through an edge (a side near the side wire 500) extending to the top surface of the underlay substrate 100 and an edge (a side near the side wire 500) extending to the bottom surface of the underlay substrate 100, are connected to the thin film transistor 200 and the side printed bonding pad 403 respectively to further achieve connection of the thin film transistor 200 located on the top surface of the underlay substrate 100 with a fanout circuit pattern 401 located on the bottom surface of the underlay substrate 100 through the side wire 500. The side wire 500 can be formed by a printing process or sequentially by a coating process and a patterning process. The side wire can use metal of a low melting point, for example, In, Ag, Ga, Sn, or an alloy thereof.

Figure 14:
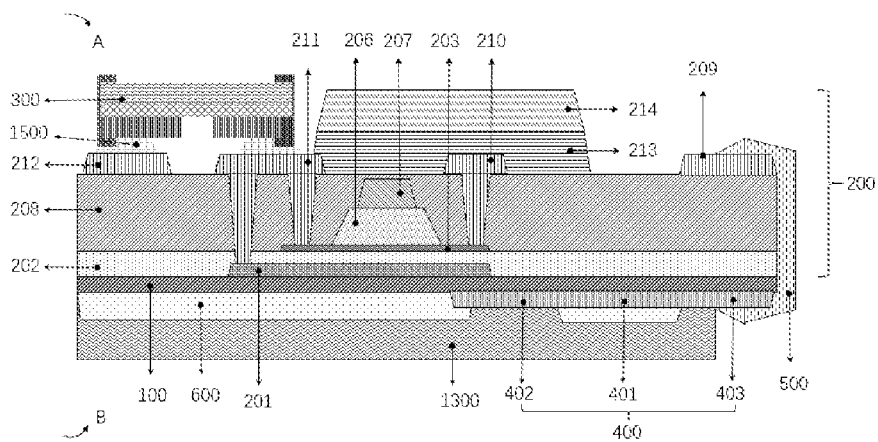
Figure 15:
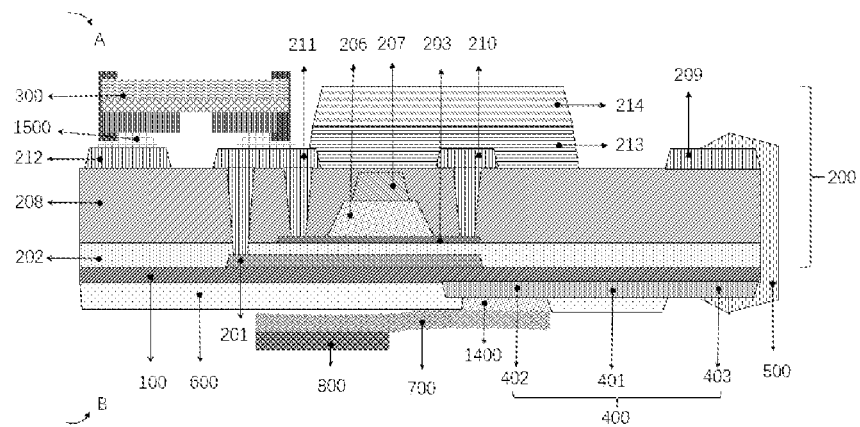

A step (14), with reference to FIG. 14, comprises removing the third top surface protective film layer 1200, transferring and bonding the micro light emitting diode 300 on the thin film transistor 200 such that two electrodes of the micro light emitting diode 300 are connected to the second source electrode/pixel electrode 211 and the common cathode 212 respectively. The micro light emitting diode 300 can be connected to second source electrode/pixel electrode 211 and the common cathode 212 the through the micro light emitting diode bonding pad 1500. The bonding and transferring operation can use a conventional method, and the present invention has no limitation thereto.

A step (15), with reference to FIG. 15, comprises removing the third bottom surface protective film layer 1300, and connecting the driver chip 800 to the bonding pad 402. For example, the driver chip 800 can be disposed on the flexible circuit board 700 through a chip-on-film (COF) process and is connected to the bonding pad 402 through the flexible circuit board 700. flexible circuit board 700 can further be connected to the bonding pad 402 through conductive glue 1400.

With reference to FIGS. 1 to 6 and FIGS. 16 to 24, another specific manufacturing for manufacturing a micro light emitting diode 300 display substrate of the present invention is provide as follows. Specifically, a solution of the first metal film layer 400 electrically connected to the first gate electrode metal layer 205 through the side wire 500 is provided. Specific steps are as follows:

Steps (1) to (6), with reference to FIGS. 1 to 6, are the same as the steps (1) to (6) of the former embodiment.

Figure 16:
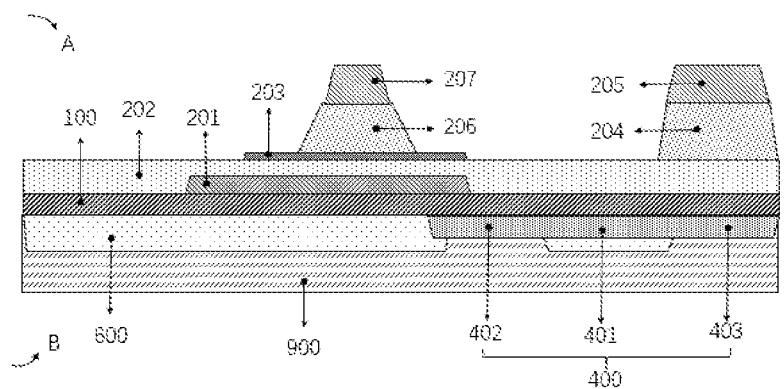
FIGS. 16 to 24 are schematic views of a manufacturing process of another embodiment of the micro light emitting diode display substrate of the present invention.

A step (7), with reference to FIG. 16, comprises manufacturing a second gate electrode insulation layer 206, a second gate electrode metal layer 207, a first gate electrode insulation layer 204, and a first gate electrode metal layer 205 on the semiconductor film layer 203, wherein the second gate electrode insulation layer 206 and the first gate electrode insulation layer 204 can be formed by one process, the second gate electrode metal layer 207 and the first gate electrode metal layer 205 can be formed by one process. For example, the semiconductor film layer 203 is coated to form a gate electrode insulation film layer, and a gate electrode metal film layer is coated on the gate electrode insulation film layer, and then the gate electrode metal film layer is patterned to obtain a second gate electrode metal layer 207 and a first gate electrode metal layer 205. Then, the gate electrode metal film layer is self-aligned patterned by using the second gate electrode metal layer 207 和 first gate electrode metal layer 205 to obtain a second gate electrode insulation layer 206 and a first gate electrode insulation layer 204. The second gate electrode insulation layer 206 is formed on the semiconductor film layer 203, and the second gate electrode metal layer 207 is formed on the second gate electrode insulation layer 206. The first gate electrode insulation layer 204 is formed on the insulation layer 202 and out of the semiconductor film layer 203, and is located on an edge of the underlay substrate 100 (the side near the side wire 500). The first gate electrode metal layer 205 is formed on the first gate electrode insulation layer 204, and a position thereof is the same as that of the first gate electrode insulation layer 204. A material of the gate electrode insulation film layer is SiOx, SiNx, a Al$_2$O$_3$/SiNx/SiOx lamination layer, or a SiOx/SiNx/SiOx lamination layer. A material of the gate electrode metal film layer is a Mo, Mo/Al lamination layer, a Mo/Cu lamination layer, a Mo/Cu/IZO lamination layer, a IZO/Cu/IZO lamination layer, a Mo/Cu/ITO lamination layer, a Ni/Cu/Ni lamination layer, a MoTiNi/Cu/MoTiNi lamination layer, a NiCr/Cu/NiCr lamination layer, or CuNb.

Figure 17:
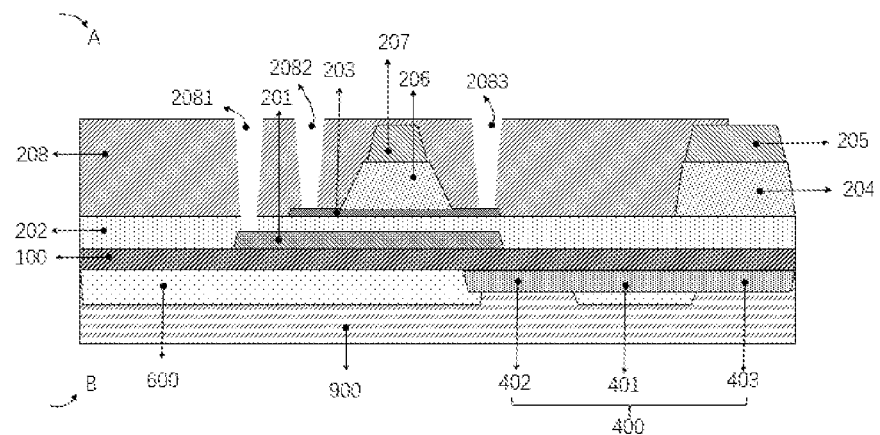

A step (8), with reference to FIG. 17, comprises coating a coating on the insulation layer 202, the semiconductor film layer 203, the second gate electrode insulation layer 206, the second gate electrode metal layer 207, the first gate electrode insulation layer 204, and the first gate electrode metal layer 205 such that the coating covers the insulation layer 202, the semiconductor film layer 203, the second gate electrode insulation layer 206, the second gate electrode metal layer 207, the portion first gate electrode insulation layer 204, and the portion first gate electrode metal layer 205, patterning the coating to form an interlayer dielectric layer 208, and defining three via holes in the interlayer dielectric layer 208 which are a first via hole 2081, a second via hole 2082, and a third via hole 2083. The first via hole 2081 extends through interlayer dielectric layer 208 and the insulation layer 202 and extends in the light shielding layer 201. Both the second via hole 2082 and the third via hole 2083 extend through interlayer dielectric layer 208 and extend in the semiconductor film layer 203. The interlayer dielectric layer 208 requires at least one portion of the surface of the first gate electrode metal layer 205 to be exposed for connecting with the side wire 500. For example, FIG. 17 shows that the interlayer dielectric layer 208 covers a side surface of the first gate electrode insulation layer 204 and a side surface and a portion of a top surface of the first gate electrode metal layer 205 while needing at least one portion of the surface of the first gate electrode metal layer 205 to be exposed and configured to connect with the side wire 500. A film layer material of the interlayer dielectric layer 208 is SiOx, SiNx or SiNOx.

Figure 18:
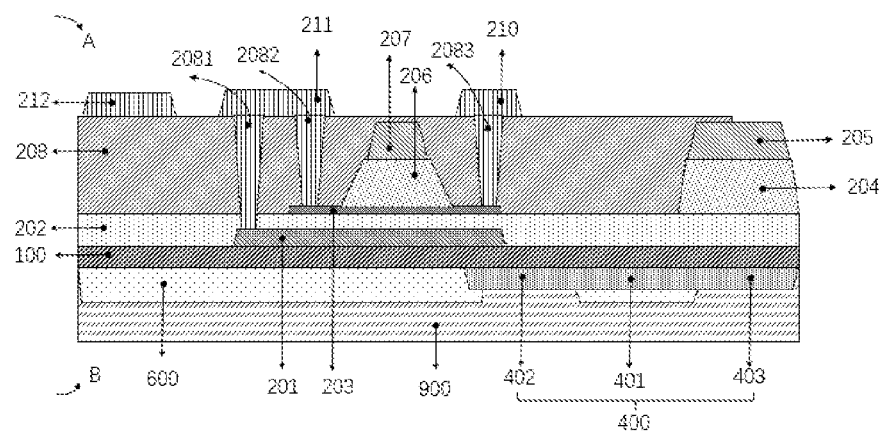

A step (9), with reference to FIG. 18, coating a metal film layer on the interlayer dielectric layer 208 and patterning the metal film layer to obtain a drain electrode 210, a second source electrode/pixel electrode 211, and a common cathode 212. The drain electrode 210 is connected to the semiconductor film layer 203 through the third via hole 2083. A portion of the second source electrode/pixel electrode 211 located above the interlayer dielectric layer 208 is named first portion and is configured to connect with the micro light emitting diode 300. A second portion of the second source electrode/pixel electrode 211 is connected to the light shielding layer 201 through the first via hole 2081. A third portion of the second source electrode/pixel electrode 211 is connected to the semiconductor film layer 203 through the second via hole 2082. The common cathode 212 is located above interlayer dielectric layer 208 and is configured to connect with the micro light emitting diode 300. A material of the metal film layer can use a Mo, Mo/Al lamination layer, a Mo/Cu lamination layer, a Mo/Cu/IZO lamination layer, IZO/Cu/IZO lamination layer, Mo/Cu/ITO lamination layer, Ni/Cu/Ni lamination layer, a MoTiNi/Cu/MoTiNi lamination layer, a NiCr/Cu/NiCr lamination layer, or CuNb.

Figure 19:
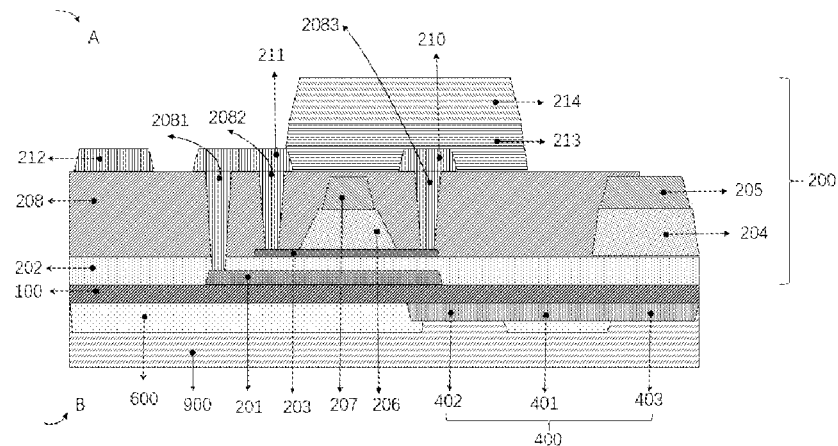

A step (10), with reference to FIG. 19, is the same as the step (10) of the former embodiment.

Figure 20:
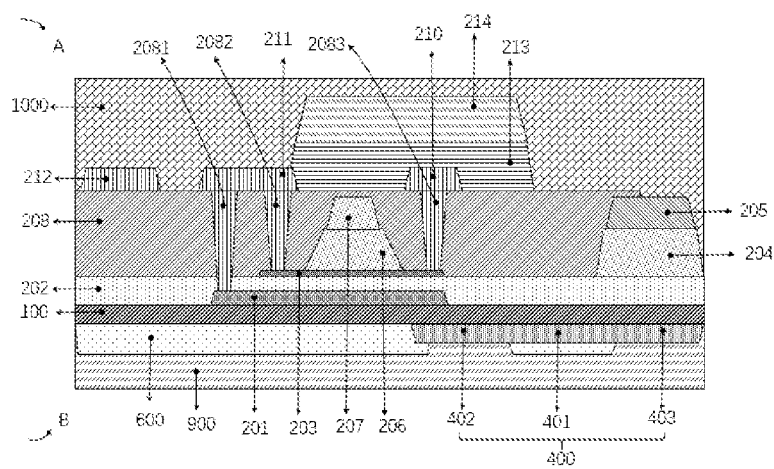

A step (11), with reference to FIG. 20, coating a second top surface protective film layer 1000 on the top surface (A surface) of the underlay substrate 100 such that the second top surface protective film layer 1000 covers the interlayer dielectric layer 208, the first gate electrode metal layer 205, the first gate electrode insulation layer 204, the second source electrode/pixel electrode 211, the common cathode 212, the second passivation layer 213, and the black matrix 214 to protect the top surface of the underlay substrate 100.

Figure 21:
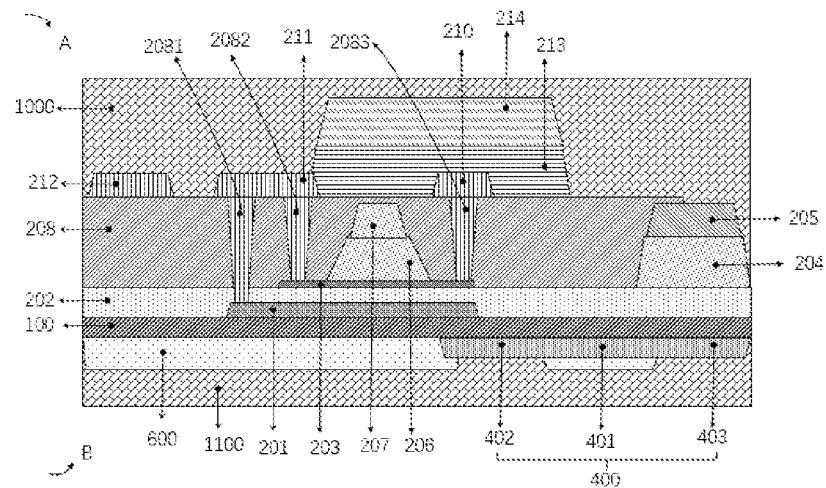

A step (12), with reference to FIG. 21, comprises removing the first bottom surface protective film layer 900, and coating a second bottom surface protective film layer 1100 on the bottom surface of the underlay substrate 100 for protecting the bottom surface circuit from damages during the process, removing the second bottom surface protective film layer 1100 and the second top surface protective film layer 1000 after a cutting process, and then coating a third top surface protective film layer 1200 and a third bottom surface protective film layer 1300 on two surfaces of the display substrate respectively to expose a connection portion between the first gate electrode metal layer 205 and the side wire 500 and a connection portion of the first metal film layer 400 and the side wire 500 (i.e., side printed bonding pad 403) for connecting with the side wire 500. A material of each of the second top surface protective film layer 1000, the second bottom surface protective film layer 1100, the third top surface protective film layer 1200 and the third bottom surface protective film layer 1300 can use organic glue.

Figure 23:
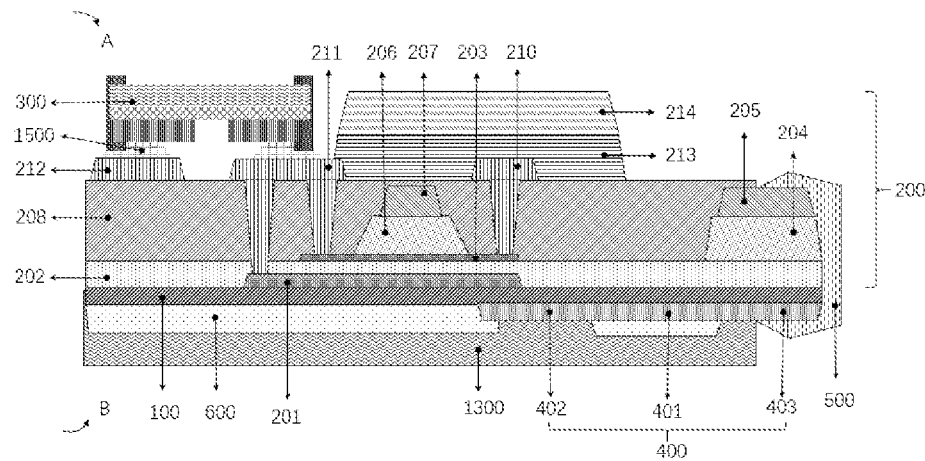
Figure 24:
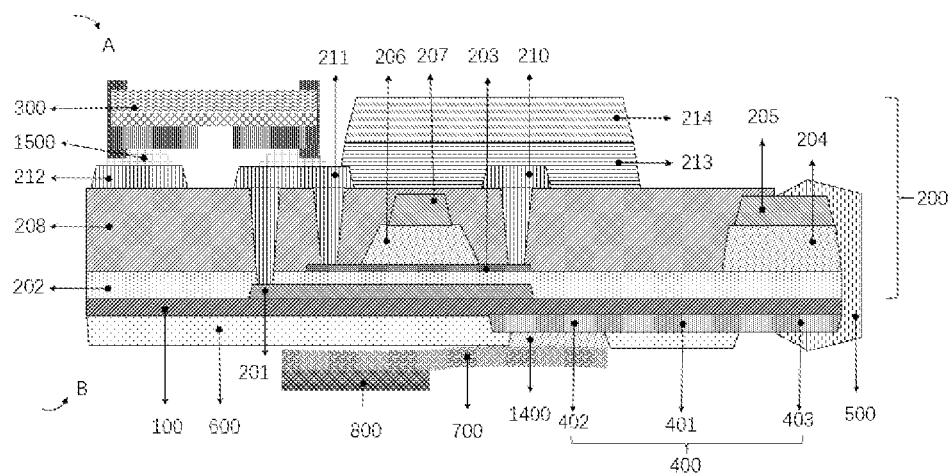

Steps (13) to (15), with reference to FIGS. 22 to 24, are the same as the steps (13) to (15) of the former embodiment.

In the above-mentioned embodiments, the descriptions of the various embodiments are focused. For the details of the embodiments not described, reference may be made to the related descriptions of the other embodiments.

It can be understood that for a person of ordinary skill in the art, equivalent replacements or changes can be made according to the technical solution of the present invention and its inventive concept, and all these changes or replacements should belong to the scope of protection of the appended claims of the present invention.

What is claimed is:

1. A micro light emitting diode display substrate manufacturing method, comprising:
   a step A, manufacturing a first metal film layer on a bottom surface of an underlay substrate, forming at least one fanout circuit pattern and a side printed bonding pad, and connecting the fanout circuit pattern to the side printed bonding pad;
   a step B, manufacturing a thin film transistor on a top surface of the underlay substrate;
   a step C, connecting a micro light emitting diode disposed on the top surface of the underlay substrate to the thin film transistor; and
   a step D, connecting the thin film transistor through a side wire disposed aside the underlay substrate to the side printed bonding pad of the first metal film layer;
   wherein the step B comprises:
   a step b6, forming a metal film layer, and patterning the metal film layer to at least form a drain electrode, a second source electrode/pixel electrode and a common cathode; and
   a step b7, self-aligned patterning and forming a second passivation layer and a black matrix layer on the drain electrode by a common mask process such that the second passivation layer covers the drain electrode and The black matrix layer covers a surface of the second passivation layer;
   wherein the step C comprises bonding the micro light emitting diode on the second source electrode/pixel electrode and the common cathode.

2. The method as claimed in claim 1, wherein the step B further comprises:
   a step b1, forming a light shielding layer on the top surface of the underlay substrate;
   a step b2, forming an insulation layer on the light shielding layer and the top surface of the underlay substrate;
   a step b3, forming a semiconductor film layer on the insulation layer;
   a step b4, forming a second gate electrode insulation layer on the semiconductor film layer and forming a second gate electrode metal layer on the second gate electrode insulation layer; and
   a step b5, forming an interlayer dielectric layer such that the interlayer dielectric layer at least covers the insulation layer, the semiconductor film layer, the second gate electrode insulation layer, and the second gate electrode metal layer;
   wherein in the step b6, the drain electrode is formed on the interlayer dielectric layer; a first portion of the second source electrode/pixel electrode is located above the interlayer dielectric layer and is connected to the micro light emitting diode, a second portion of the second source electrode/pixel electrode extends through the interlayer dielectric layer and the insulation layer and is connected to the light shielding layer, a third portion of the second source electrode/pixel electrode extends through the interlayer dielectric layer and is connected to the semiconductor film layer; a portion of the drain electrode is formed on the interlayer dielectric layer, and another portion extends through the interlayer dielectric layer and is connected to the semiconductor film layer.

3. The method as claimed in claim 2, wherein in the step b6, the patterning step also forms a first source electrode, the first source electrode is formed on the interlayer dielectric layer and is located on an edge of the underlay substrate; the step D comprises connecting the first source electrode to the side printed bonding pad of the first metal film layer through the side wire disposed aside the underlay substrate.

4. The method as claimed in claim 2, wherein the step b4 further comprises forming a first gate electrode insulation layer above the insulation layer, outside the semiconductor film layer, and on the edge of the underlay substrate, and forming a first gate electrode metal layer above the first gate electrode insulation layer; in the step b5, the interlayer dielectric layer also covers a portion of the first gate electrode insulation layer and a portion of the first gate electrode metal layer such that at least one portion of a surface of the first gate electrode metal layer is exposed and configured to connect with the side wire; the step D comprises connecting the first gate electrode metal layer through the side wire disposed aside the underlay substrate to the side printed bonding pad of the first metal film layer.

* * * * *